United States Patent

Hovnanian et al.

[15] 3,670,208

[45] June 13, 1972

[54] MICROELECTRONIC PACKAGE, BUSS STRIP AND PRINTED CIRCUIT BASE ASSEMBLY

[72] Inventors: Vram E. Hovnanian, Sherman Oaks; Edward Kitzmiller, Manhattan Beach, both of Calif.

[73] Assignee: Logic Dynamics, Inc., El Segundo, Calif.

[22] Filed: July 13, 1970

[21] Appl. No.: 54,325

[52] U.S. Cl. ......................................317/101 CM, 174/68.5

[51] Int. Cl. .......................................................H05k 1/04

[58] Field of Search ....................174/68.5, 72 R, 72 A, 72 B, 174/72 C, 72 TR; 317/101 CM, 101

[56] References Cited

UNITED STATES PATENTS

| | | | |
|---|---|---|---|
| 3,418,535 | 12/1968 | Martinell | 317/101 CM |
| 3,499,218 | 3/1970 | Dahlgren et al. | 174/68.5 X |
| 3,474,297 | 10/1969 | Bylander | 174/68.5 X |
| 3,302,067 | 1/1967 | Jackson et al. | 317/101 CM |

*Primary Examiner*—J. R. Scott
*Attorney*—Miketta, Glenny, Poms and Smith

[57] ABSTRACT

A space-saving assembly including a printed circuit card with aligned sets of wire lead mounting terminals such as holes therethrough arranged in modularly spaced parallel rows, a strip including ground and voltage supply busses separated by insulation, located on the card between the holes of each of the aligned sets with a wire lead from each strip extending into respective diagonally opposite holes of each set, and Dual-In-Line Packages (DIP) located over the buss strip with the package wire leads extending into the respective holes of the respective set to be soldered to respective printed leads on the card, with the buss strip under the DIPs acting as the heat sink for the DIPs. An alternative embodiment of the buss strip has one of the conductive busses formed in a U-shaped section providing buss elements above and below the other buss thereby shielding the latter. A second alternative embodiment of the buss strip has three busses with three respective leads for each set of holes to provide ground and voltage at two different potentials to each DIP.

6 Claims, 8 Drawing Figures

INVENTORS.
VRAM E. HOVNANIAN
EDWARD KITZMILLER
By
Miketta, Glenny, Poms & Smith
ATTORNEYS.

MICROELECTRONIC PACKAGE, BUSS STRIP AND PRINTED CIRCUIT BASE ASSEMBLY

BACKGROUND OF THE INVENTION

This invention relates to electrical systems and more particularly to such a system using a printed circuit base mounting a power supplying buss strip and a multiplicity of microelectronic packages.

In the design of electrical circuits, the trend is to smaller and smaller components so that today the electronic elements are installed in microelectronic packages such as integrated circuit packages which are in turn installed on bases such as printed circuit boards or cards. A common installation has Dual-In-Line packages (DIPs) mounted in rows on a P-C card with buss strips located between the rows to bring power in the form of voltages at desired potentials and ground to the individual packages.

The buss strips for such cards are conventionally constructed in a tree-shape with a plurality of individual buss limbs extending from a common buss trunk, to run between the rows of packages. Usually the individual buss limbs are as wide as the packages themselves in order to provide sufficient current carrying capacity and for other reasons. Typically the width of the individual buss limbs is 0.300 inch while the recommended minimum spacing between DIPs is 0.100 inch so that 0.200 inch could be saved per row of DIPs by redesign of the P-C card and relocation of the buss strips. Also by such redesign favorable advantage could be taken of the other modular spacings, established from time to time by appropriate agencies and groups.

The conventional width of the individual buss limbs requires that the buss tree actually occupy more of the space on the P-C card than do the DIPs since the tree has a trunk and an extra buss limb as well as a buss limb for each row of DIPs. If the rows of DIPs could be located at the minimum spacing, the size of the board for a given circuit could be reduced, or the number of circuits on a given board could be increased substantially. However with the DIPs so located there would be no space for the buss limbs or trunk and another location for the buss strip would be required.

Also with the use of buss trees, the shape of the buss tree, being the largest component on the circuit board, dictates the location of the smaller but more important DIPs. The designer of a given circuit board is required to select a suitable buss tree first and then fit the location of the individual DIPs to the selected buss tree to insure that there is sufficient spacing between the rows of DIPs for the buss limbs. If a more flexible assembly of DIPs and buss strips could be provided, the designer would have greater latitude in the location and spacing of the rows of DIPs without being limited by the shape of the buss tree.

BRIEF DESCRIPTION OF THE INVENTION

Therefore it is the primary object of this invention to provide a novel microelectronic package buss strip and printed circuit base assembly.

Other and additional objects of this invention are to provide an assembly with the rows of integrated circuit packages located close together, to provide such an assembly without space being required between the rows of packages for the buss limbs to pass therebetween, to provide such an assembly with the buss strip located on the circuit board under the rows of packages, to provide such an assembly with such a buss strip which provides both ground and power to each package thereover, to provide such an assembly with such a buss strip which can be made in various lengths to accommodate various sizes and numbers of packages, to provide such an assembly with such a buss strip with a metal center which acts as a heat sink under the packages to eliminate hot spots, and to provide such an assembly for a circuit board which is versatile, space saving and economical.

Generally the microelectronic package, buss strip and printed circuit base assembly includes a base of dielectric material having a plurality of wire lead mounting terminals, a buss strip with wire leads and located on the member adjacent the terminals for supplying electrical power, and microelectronic package with the package being located over the buss strip and electrically connected thereto by the wire leads thereof and of the buss strip being received by the terminals of the base. The terminals of the base may be located in parallel lines in sets, two lines to a row with closely spaced rows. The buss strip may be a sandwich with several conductive busses separated by insulation and having leads projecting therefrom to each set of terminals. One of the busses may be provided with a U-cross-section with the other buss located between the parallel elements thereof to be shielded thereby.

DETAILED DESCRIPTION OF THE PREFERRED EMBODIMENT

Figures 1, 2, 3, 4, 5, 6, 7, 8:
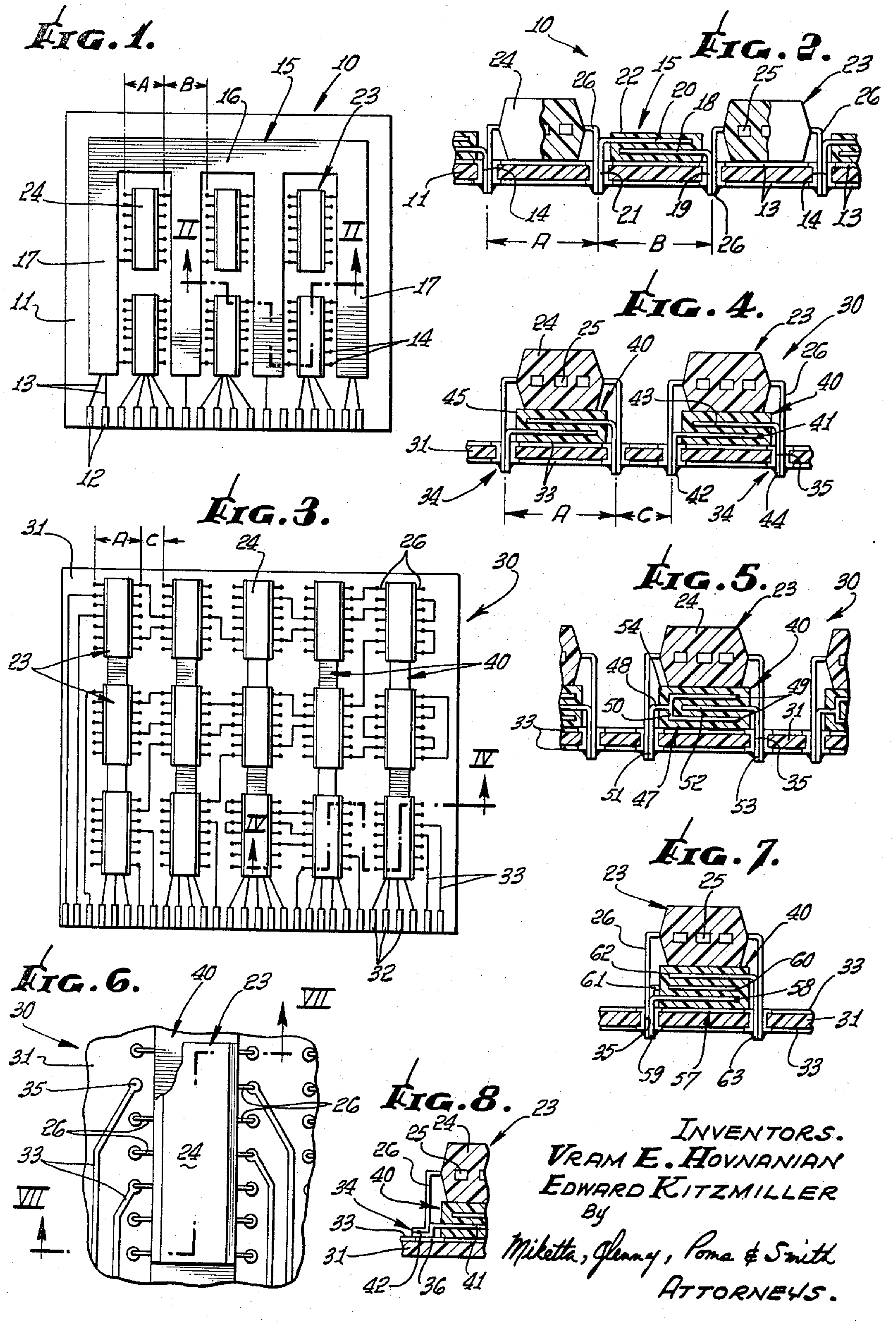
FIG. 1 is a plan view of a prior art assembly showing a typical buss tree and DIP arrangement thereof.
FIG. 2 is a stepped sectional view taken along the stepped plane II-II of FIG. 1 showing the electrical connections of the buss tree and DIPs of the prior art assembly.
FIG. 3 is a plan view similar to FIG. 1 of the microelectronic package, buss strip and printed circuit base assembly according to this invention, showing the closely spaced rows of DIPs.
FIG. 4 is a stepped sectional view taken along the stepped plane IV-IV of FIG. 3 showing the electrical connections of the buss strip and DIPs of the assembly according to this invention.
FIG. 5 is a stepped sectional view, similar to FIG. 4 of the assembly according to this invention showing a first alternative embodiment of the buss strip.
FIG. 6 is a fragmentary plan view of a portion similar to a portion of FIGS. 1 and 3 of the assembly according to this invention, showing the second alternative embodiment of the buss strip.
FIG. 7 is a stepped sectional view taken along the plane VII—VII of FIG. 6 showing the electrical connections of the second alternative embodiment of the buss strip and the DIPs.
FIG. 8 is a fragmentary plan view similar to a portion of FIG. 4 showing an alternative terminal connection for the wire leads of the DIPs and the buss strip.

Referring now to the Figs., and particularly to FIGS. 1 and 2, the prior art assembly is indicated generally by the numeral 10. The prior art assembly 10 includes a base in the form of a printed circuit card 11 of conventional construction having a multiplicity of tongues 12 along both sides of one edge thereof with conductors or printed leads 13 extending therefrom to terminals typically circuit or lead mounting holes 14. The holes 14 are in parallel lines with usually 7 holes equally spaced in a line and across from a similar 7 in the next line to form a set of 14 holes. The two adjacent lines are a row with a space A between the lines of a row and space B between the rows. Typically the spaces A and B are equal.

A buss strip in the form of a buss tree 15 is located on the card 11. The buss tree 15 includes a trunk 16 with a multiplicity of limbs 17 extending between the rows of holes 14. The buss tree 15 includes a ground conductive buss 18 in each of the limbs 17 and the trunk 16 with a multiplicity of spaced ground wire leads 19 extending from the right edge thereof to be inserted into respective holes 14, typically the lower left hole of each set, in the printed circuit card 11. The buss tree 15 also includes a power conductive buss 20 in the limbs 17 and trunk 16 thereof with a multiplicity of spaced wire leads 21 extending from the left side of the limbs into another respective hole 14, typically the upper right hole of each set, in the printed circuit card 11. The ground conductive buss 18 and the power conductive buss 20 are insulated from each other by insulation 22. The buss tree 15 connects each set of openings 14 to ground and to a source of electrical power via the busses 18 and 20 through wire leads 19 and 21 for any one set of holes 14, come from different limbs 17 of the buss tree 15.

The prior art assembly 10 also includes integrated circuit packages shown as being Dual-In-Line packages or DIPs 23. The DIPs 23 have a body 24 containing electrical elements 25 from which a multiplicity of wire leads 26 typically in sets of six or seven per side extend outward and downwardly from the sides thereof to be received in the sets of wire lead mounting holes 14 in the printed circuit card 11. The DIPs are located between the limbs 17 of the buss tree with one limb 17 supplying power to each DIP 23 and the adjacent limb 17 on the left supplying ground to that particular DIP 23.

It should be noted that the limbs 17 are typically as wide as the DIPs 23 i.e. 0.300 in. The width of the limbs 17 requires that the buss tree 15 occupy more of the space of the printed circuit card 11 than do the DIPs 23 since the tree 15 in addition to the limbs 17, also must have a trunk 16 and an extra limb 17. The occupying by the buss tree 15 of so much of the space of the printed circuit card 11 is an undesirable waste of space that could be used to hold the more important DIPs 23. If the buss tree were eliminated from between the rows of DIPs 23, on the printed circuit card 11, the rows of DIPs could be more closely spaced together, i.e. down to the recommended minimum of 0.100 in. to accommodate a greater number of DIPs per P-C cards.

The microelectronic package, buss strip and printed circuit base assembly according to this invention is indicated generally at 30. By contrast with the prior art arrangement of FIGS. 1 and 2, the assembly 30, as best seen in FIG. 3, effectively moves the rows of DIPs 23 closer together by eliminating the buss tree 15 from between the rows of DIPs 23.

Generally the assembly 30 according to this invention includes a similar but improved printed circuit card 31. The improved card 31 is provided with terminals 34 in parallel lines, with two lines to a row. The rows are closely separated by space C with the buss strip 40 being located in the space A between the parallel lines of terminals 34 of a particular row. The buss strip 40 is provided with first alternative construction having an alternative ground buss 48 surrounding the power conductive buss 52, and a second alternative construction with three busses 58, 60 and 62 to provide ground and two different electrical potential to the DIPs 23.

Referring now to FIG. 3, the printed circuit card 31 of the assembly 30 according to this invention includes a multiplicity of conductive tongues 32 on both sides of one edge of the P-C card with printed leads 33 extending therefrom to terminals 34. The terminals 34 are usually circuit holes 35 shown in FIG. 3 through 7 but they may be surface pads 36 as shown in FIG. 8 or any other type of terminal desired. The holes 35 are arranged in parallel lines of six or seven equally spaced holes, which together make up a set of 12 or 14.

A space A is provided between the parallel lines of the set which is the same as the space A in a prior art assembly. However, there is a space C between the rows which is considerably less than the space B between the rows in the prior art assembly. With less space C between the rows, there can be more rows for a given size printed circuit card 31 and therefore more sets of holes 14 per circuit card 31. With the provision of more sets of holes 14 the tongues 32 will be more numerous as will the printed leads 33. With greater numbers of tongues 32 and printed leads 33, in order to keep the electrical resistance thereof low, the thickness of the tongues 32 and the printed leads 33 may need to be suitably increased but this is easily accomplished during the manufacture of the improved printed circuit card 31, if required.

The buss 40 has a preferred embodiment shown in FIG. 4 which includes a ground conductive buss 41 with spaced wire leads 42 extending from the left side thereof outwardly and downwardly into the lower left holes of each set of circuit holes 35. A power conductive buss 43 is located over the ground conductive buss 41 and has a multiplicity of spaced wire leads 44 extending from the right side thereof outwardly and downwardly into the upper right holes of a set of circuit holes 35. Of course the busses 41 and 43 are separated by insulation 45 just as before. The buss strip 40 is very thin having a maximum thickness of 0.035 inch. It is contemplated that a suitable conductor material for the busses would be a spring tempered phospor bronze compound with the wire leads plated with tin for ease of soldering.

In the assembly 30, the microelectronic packages such as DIPs 23 are bridged on the printed circuit card 31 on the buss strip 40 with the wire leads 25 thereof extending into respective holes 35 to be soldered to the printed leads 33 along with the wire leads 42 and 44 of the busses 41 and 43, respectively, to supply power and ground to each DIPs 23.

The steps of assembly will include locating the buss lines 40 on the P-C card 31 between the holes 35 of the parallel lines of each row, inserting the wire leads 42, and 44 thereof into the lower left hole and upper right hole respectively of the holes 35 of each set, placing the DIPs 23 bridged on the P-C card 31 on the buss strips 40 with the wire leads 25 thereof on opposite sides of the strip 40, inserting the wire leads 25 thereof in respective holes 35 of the respective set, and soldering the wire leads 26, 42 and 44 to the printed lead 33 running to the respective holes 35 to electrically connect the buss strip 40 and the DIPs 23.

It will be readily seen that by the positioning of the buss strip 40 between the printed circuit card 31 and the DIPs 23, the rows 36 can be much more closely spaced than under the prior art assembly 10. Additionally, it should be noted that by placing the buss strip 40 under the DIPs 30, the conductive busses 41 and 43 are located directly under the DIPs 23 to transfer heat from the DIPs 23 and thereby act as a heat sink to eliminate hot spots. The conductive busses 41 and 43 are a much better heat conductor than is the dielectric base material of the printed circuit card 11 which is underneath the DIPs 23 in the prior art assembly 10.

The assembly 30 may be used with alternative constructions of the buss strip 40. A first alternative embodiment generally indicated by the number 47 is shown in FIG. 5. The first alternative embodiment provides an alternative ground conductive buss 48 including parallel elements 49 interconnected by a yoke element 50 with a multiplicity of spaced ground wire leads 51 extending from the left side thereof outwardly and downwardly as before. The power conductive buss 52 is located between the parallel element 49 of the ground buss 48 again with a multiplicity of spaced power wire leads 53 extending from the right side thereof outwardly and downwardly as before. Insulation 54 separates the power conductive buss from the parallel elements 49 and the yoke element 50. The provision of the parallel elements 49 and yoke element 50 around the power conductive buss 52 shields the power conductive buss 52 from having stray high frequency currents induced therein to produce noise.

It should be noted that the first alternative embodiment of the buss strip 40 because of the limited thickness thereof cannot have the conductive busses 48 and 52 as thick as the conductive busses 41 and 43 of the preferred embodiment and therefore busses 48 and 52 do not have as great a current carrying capacity. However, in many applications, the shielding of the power conductive busses 52 is more advantageous than the higher current carrying capacity of buss 43 of the preferred embodiment.

A second alternative embodiment of the buss strip 40 is shown in FIGS. 6 and 7. The second alternative is generally indicated by the numeral 57 and includes a ground conductive buss 58 having a multiplicity of spaced ground wire leads 59 extending from the left side of the strip outwardly and downwardly as before. The second alternative 57 has a first power conductive buss 60 located directly above the ground conductive buss 58 and having a multiplicity of spaced power wire leads 61 extending from the left side thereof outwardly and downwardly to be inserted into the upper left hole of each set of circuit holes 35 as is best seen in FIG. 6. A second power conductive buss 62 is located above the first power conductive buss 60 and has a multiplicity of spaced power wire leads 63 extending from the right side thereof between the spaced power wire leads outwardly and downwardly to enter the upper right hole of each set of circuit holes 35. The first and second power conductive busses 60 and 62 are provided with different electrical potentials to supply the DIPs 23 with different electrical potentials as required.

It should be obvious that if a particular DIP 23 does not require either ground or power, the respective wire lead for that DIP may be cut off at the insulation and the open surface thereof sealed to bypass that particular DIP 23.

As best seen in FIG. 8, the terminals 34 need not always be circuit holes 35 but may also include pads 36. With the pads 36, the wire leads from the DIPs 23 and the buss strip 40 will be bent to provide a horizontal foot for engaging the pads 36 to be soldered or welded thereto. The assembly 30 according to this invention can be used with any type of terminal 34 of which the holes 35 and the pads 36 are illustrative.

Also it should be understood that the provision of busses 40 containing both the ground lead and the power lead for an individual DIP 23 somewhat reduces the capacitance therebetween because it eliminates parallel surface areas between the ground conductive buss 41 and the power conductive buss 43 versus the ground conductive buss 18 and power conductive buss 20 of the prior art assembly 10, but this loss in capacitance is more than offset by the savings in space and greater versatility of the integrated circuit package and capacitance power supply assembly.

We claim:

1. A microelectronic package, buss strip and printed circuit base assembly comprising:
   - a base of dielectric material having a plurality of apertured terminals, and printed leads connected thereto each adapted to receive a wire lead for use in making an electrical circuit;
   - a multi-conductor buss strip with wire leads extending downwardly therefrom, said strip being located on the base with said leads projecting through and in electrical contact with selected terminals herein referred to as power terminals for supplying electrical power at electrically different potentials to the selected terminals; and
   - a microelectronic package having a plurality of wire leads extending downwardly therefrom, said package being located over the buss strip and with its leads projecting through and in electrical contact with selected terminals including said power terminals.

2. In an electrical assembly including a base of dielectric material provided with a plurality of apertured terminals and printed leads connected thereto, each terminal being adapted to receive a wire lead for use in making an electrical circuit, and a microelectronic package having a plurality of wire leads extending downwardly therefrom for insertion into and electrical contact with selected terminals, the improvement comprising the provision of:
   - a multi-conductor buss strip, the conductors thereof having wire leads extending downwardly therefrom for insertion into and electrical contact with certain of the selected terminals for supplying thereto electrical power at electrically different potentials, said buss strip immediately overlying the base and underlying said package.

3. The invention as defined in claim 1 wherein each conductor of the buss strip is elongated, flat and of uniform cross-sectional area throughout its length.

4. The invention as defined in claim 2 wherein the widths of the strip and of the package are substantially equal.

5. The invention as defined in claim 2 wherein the buss strip includes a sandwich of conductors, one of said conductors including upper and lower parallel elements interconnected by a yoke element and another of said conductors being located between and spaced from the parallel elements.

6. The invention as defined in claim 2 wherein the buss strip includes a sandwich of upper, intermediate and lower conductors insulated from one another, said conductors being of different electric potential.

* * * * *